United States Patent
Lee

(10) Patent No.: US 7,030,507 B2
(45) Date of Patent: Apr. 18, 2006

(54) TEST PATTERN OF SEMICONDUCTOR DEVICE

(75) Inventor: Joon Hyeon Lee, Chungcheongbuk-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 10/874,491

(22) Filed: Jun. 22, 2004

(65) Prior Publication Data

US 2005/0077514 A1    Apr. 14, 2005

(30) Foreign Application Priority Data

Oct. 8, 2003   (KR) .................... 10-2003-00699809

(51) Int. Cl.
   *H01L 23/544*   (2006.01)

(52) U.S. Cl. ...................... 257/797; 257/758

(58) Field of Classification Search ................ 257/48, 257/758, 797, 786
   See application file for complete search history.

(56) References Cited

U.S. PATENT DOCUMENTS

| | | | | |
|---|---|---|---|---|
| 3,922,707 A | * | 11/1975 | Freed et al. | 257/536 |
| 6,042,933 A | * | 3/2000 | Hirai et al. | 482/209 |
| 6,232,619 B1 | * | 5/2001 | Chen et al. | 257/48 |
| 6,559,475 B1 | * | 5/2003 | Kim | 257/48 |
| 6,577,149 B1 | * | 6/2003 | Doong et al. | 324/765 |
| 6,787,800 B1 | * | 9/2004 | Weiland et al. | 257/48 |

* cited by examiner

*Primary Examiner*—S. V. Clark
(74) *Attorney, Agent, or Firm*—Ladas & Parry LLP

(57) ABSTRACT

Disclosed is a test pattern comprising: lower metal patterns for test formed in such a manner that crank-type patterns are arranged in sequence overlapping on each other in a view along a vertical line; hole patterns formed in such a manner that each of the hole patterns exposes either a front end and a rear end of each crank-type lower metal pattern; and upper metal patterns formed in such a manner that each upper metal pattern interconnects a front end of each lower metal pattern and a rear end of an adjacent lower metal pattern overlapping on each other in a view along a vertical line.

2 Claims, 4 Drawing Sheets

TEST PATTERN OF SEMICONDUCTOR DEVICE

BACKGROUND OF THE INVENTION

1. Field of the Invention

The present invention relates to a method for manufacturing a semiconductor device, and more particularly to a test pattern which allows a cause of a failure in a borderless via hole to be precisely understood.

2. Description of the Prior Art

As known in the art, a semiconductor device is manufactured in a laminated layered structure. Accordingly, in metal wiring for electrical connection between upper wiring and lower wiring, a multi-layer metal wiring structure is employed, which allows wiring design to be easy and setting for wiring resistance and electric current capacity to be freely performed.

In such a multi-layer metal wiring structure, electric contact between lower metal wiring and upper metal wiring is generally performed by via contacts. In order to form such via contacts, an interlayer dielectric layer formed so as to cover the lower metal wiring is etched, via holes for exposing portions of the lower metal wiring is formed, and plugs are formed in the via holes. Therefore, the lower metal wiring is contacted with the upper metal wiring through the plugs.

Meanwhile, when the multi-layer metal wiring is formed, it is very important to check alignment state between the upper metal wiring and the lower metal wiring and to allow precise alignment to be performed between the upper metal wiring and the lower metal wiring through the checking, in view of device reliability and manufacturing yield.

Accordingly, in a typical semiconductor manufacturing process, a test pattern is inserted into a separate space in order to check the alignment state between the upper metal wiring and the lower metal wiring. A structure of a typical bordered via test pattern formed in a conventional semiconductor device is as shown in FIGS. 1a and 1b.

In FIGS. 1a and 1b, a reference numeral 2 represents lower metal patterns, a reference numeral 4 represents hole patterns, and a reference numeral 6 represents upper metal patterns.

Referring to FIG. 1a, each lower metal pattern 2 and each upper metal pattern 6 are shaped like a bar, each hole pattern 4 is formed to expose one end and the other end of each lower metal pattern 2, and each upper metal pattern 6 is formed so that its one end and the other end are disposed on each hole pattern 4.

Herein, as shown in FIG. 1b, when it is assumed that each hole pattern 4 has a size of 0.22 μm, a side margin A and an end margin B between each hole pattern 4 and each lower metal pattern 2 are respectively 0.04 μm and 0.04 μm, and a hole pitch C to an X axis is 0.66 μm, a line width W in a Y axis direction of the lower metal pattern 2 is 0.30 μm and a length L in an X axis of the lower metal pattern 2 is 0.96 μm. Also, the hole pitch C becomes a pitch of the lower metal pattern 2 with respect to the X axis.

Meanwhile, each upper metal pattern 6 formed on an upper side of each hole pattern 4 may be patterned in consideration of a side margin and an end margin with each hole pattern 4, or may have margins larger than the side margin and the end margin.

FIGS. 2a and 2b are views of a conventional borderless via test pattern. As shown in FIGS. 2a and 2b, the test pattern shows a structure in which a borderless via has hole patterns 4a shifted with an angle of 45° in comparison with the structure shown in FIGS. 1a and 1b, so as to prevent the hole patterns 4a from being exactly landed to the lower metal pattern 2s.

Herein, a side margin a and an end margin b between each lower metal pattern 2 and each hole pattern 4a are respectively −0.04 μm and −0.04 μm.

As described above, in the conventional test pattern shown in FIGS. 1a and 1b, alignment state between each lower metal pattern and each hole pattern can be easily understood. However, when a bordered via occurs due to occurrence of alignment failure, it cannot be precisely understood whether the alignment failure has been caused by a misalignment of the hole pattern or line shortening of the lower metal pattern because the hole pattern is shifted in only one direction.

Especially, since the conventional test pattern is very different from those of metal wiring of an SRAM cell block in shapes, the conventional test pattern cannot precisely reflect a cell.

SUMMARY OF THE INVENTION

Accordingly, the present invention has been made to solve the above-mentioned problems occurring in the prior art, and it is an object of the present invention to provide a test pattern of a semiconductor device which allows the cause of alignment failure between a lower metal pattern and a hole pattern to be precisely understood.

It is another object of the present invention to provide a test pattern of a semiconductor device capable of precisely reflecting a cell.

In order to achieve the above objects, according to one aspect of the present invention, there is provided a test pattern formed in order to understand alignment state and cause of alignment failure between lower metal wiring and via contacts when multi-layer metal wiring is formed in a cell area, the test pattern comprising: lower metal patterns for test formed in such a manner that crank-type patterns are arranged in sequence overlapping on each other in a view along a vertical line; hole patterns formed in such a manner that each of the hole patterns exposes either a front end and a rear end of each crank-type lower metal pattern; and upper metal patterns formed in such a manner that each upper metal pattern interconnects a front end of each lower metal pattern and a rear end of an adjacent lower metal pattern overlapping on each other in a view along a vertical line.

In order to achieve the above objects, according to one aspect of the present invention, there is provided a test pattern formed in order to understand alignment state and cause of alignment failure between lower metal wiring and via contacts when multi-layer metal wiring is formed in a cell area, the test pattern comprising: lower metal patterns for test formed in such a manner that crank-type patterns are arranged in sequence overlapping on each other in a view along a vertical line; hole patterns formed in such a manner that, in relation to the crank-type lower metal patterns having ends overlapping on each other, a first hole pattern disposed at an upper side is shifted leftward and downward by a predetermined angle so as to expose a first end of a lower metal pattern, and a second hole pattern disposed at a lower side is shifted rightward and upward by a predetermined angle so as to expose a second end of a lower metal pattern; and upper metal patterns formed in such a manner that each upper metal pattern interconnects a front end of each lower metal pattern and a rear end of an adjacent lower metal pattern overlapping on each other in a view along a vertical line.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENTS

Hereinafter, a preferred embodiment of the present invention will be described with reference to the accompanying drawings.

Figure 1A:
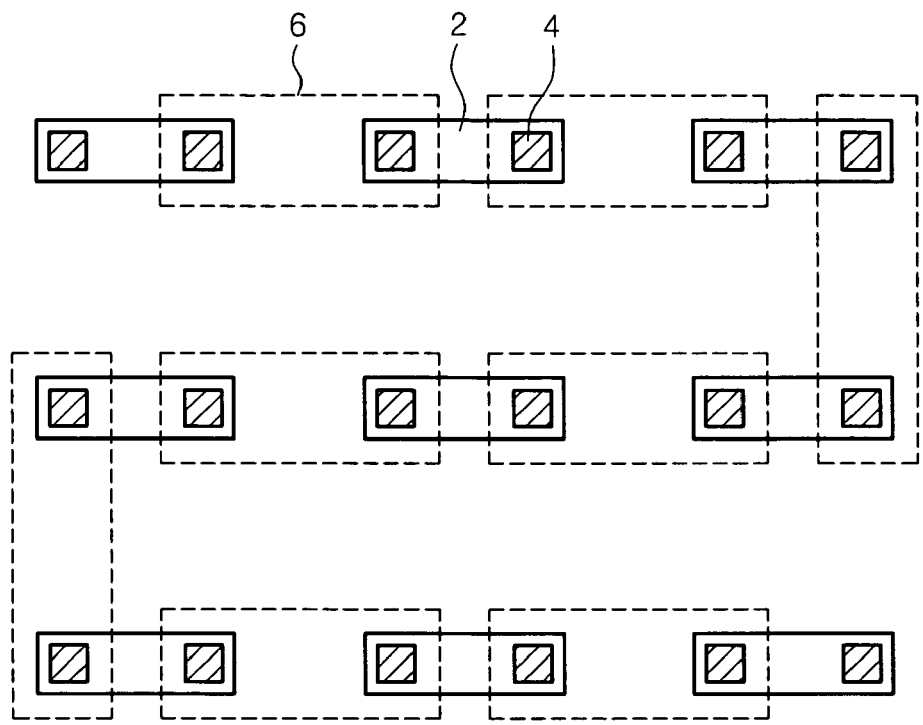
FIGS. 1a and 1b are views of a conventional bordered via test pattern.
Figure 1B:
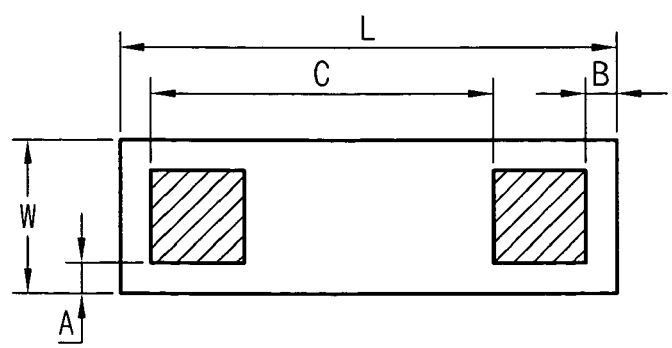
Figure 2A:
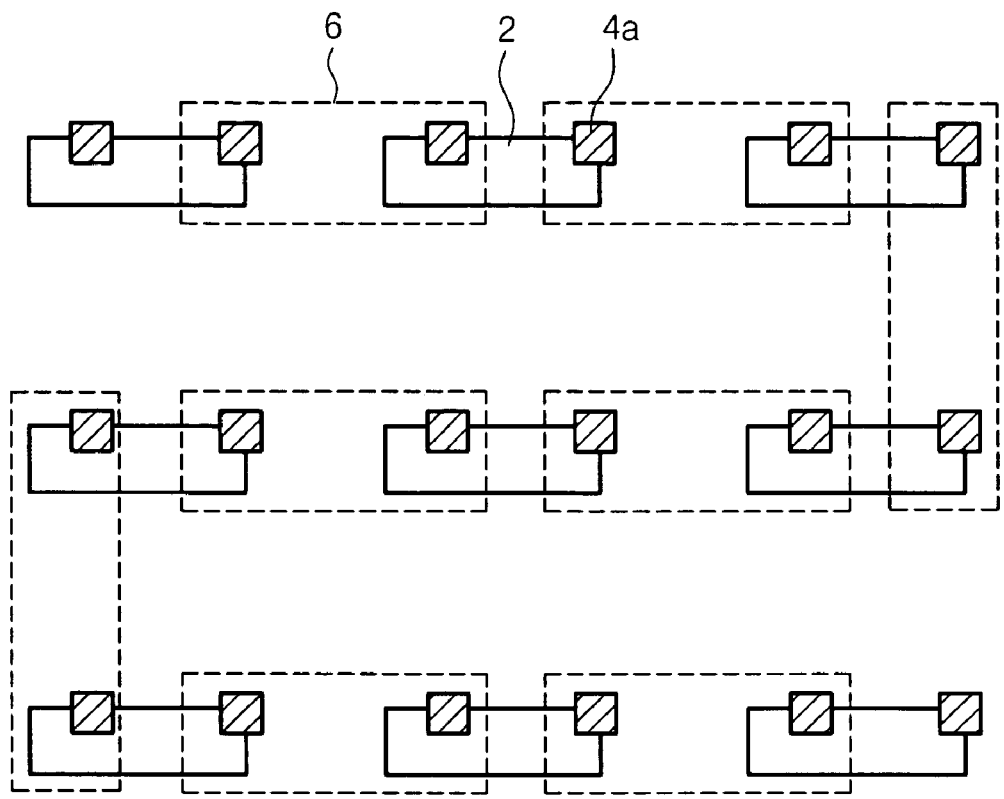
FIGS. 2a and 2b are views of a conventional borderless via test pattern.
Figure 2B:
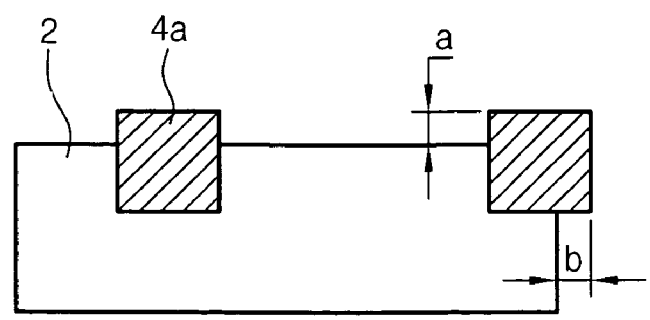
Figure 3A:
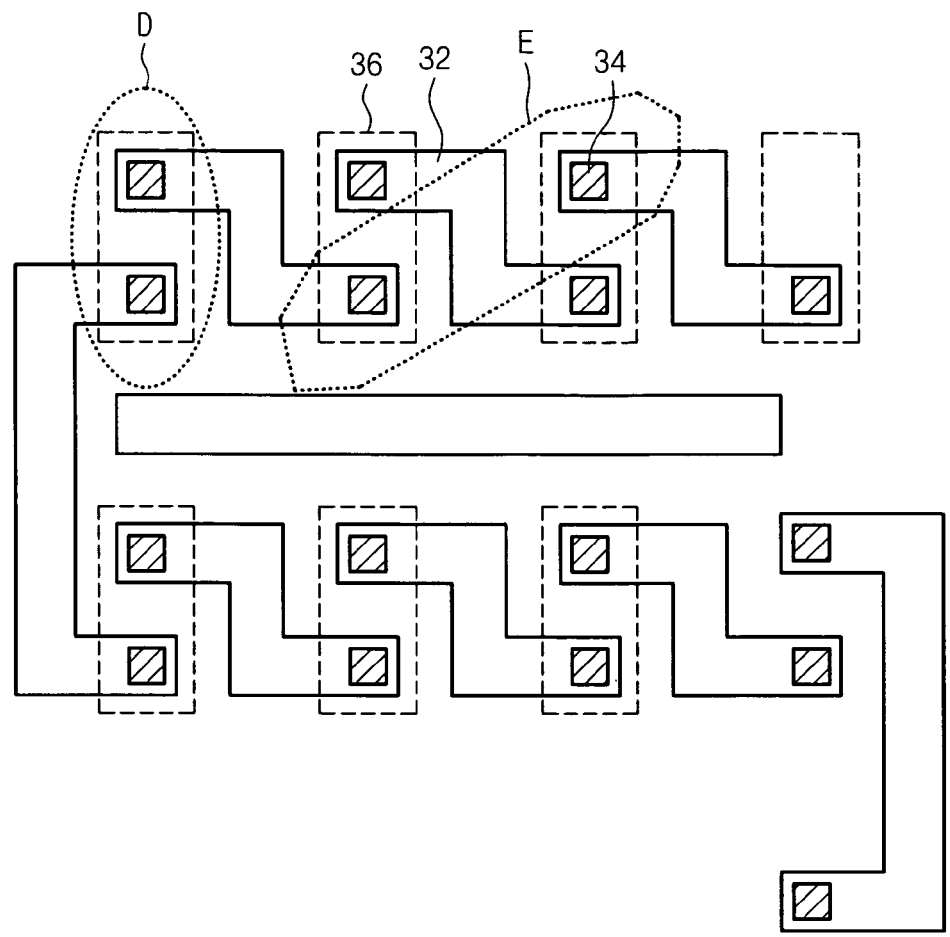
FIGS. 3a and 3b are views of a bordered via test pattern according to an embodiment of the present invention.
Figure 3B:
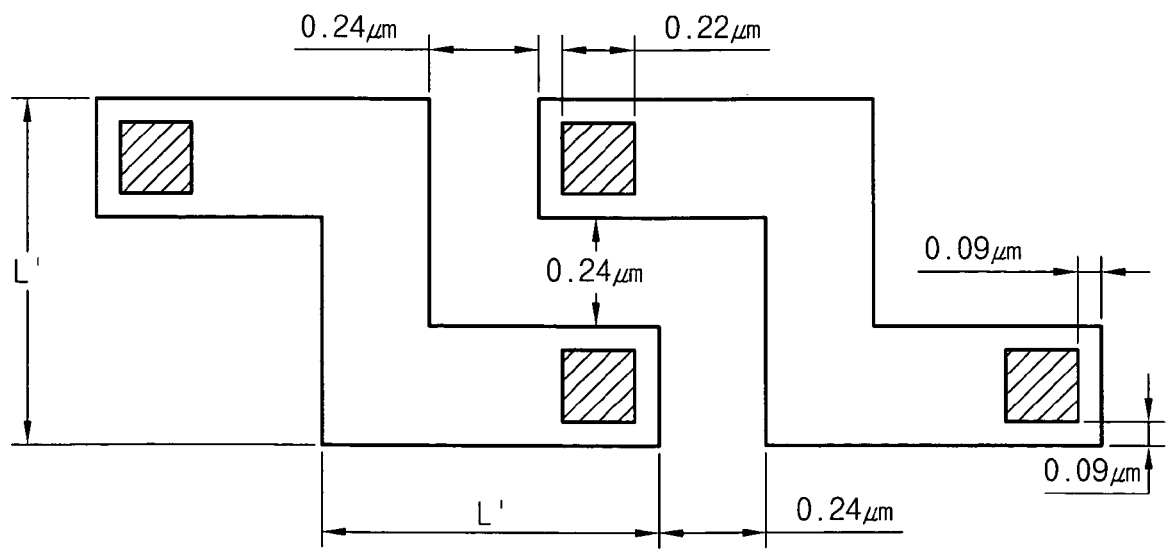

FIGS. 3a and 3b are views of a bordered via test pattern according to an embodiment of the present invention.

Referring to FIG. 3a, the bordered via test pattern of the present invention includes lower metal patterns 32 each of which shaped like a crank, in contrast with a conventional lower metal pattern shaped like a bar. Especially, a plurality of lower metal patterns 32 are arranged in sequence in such a manner that a front end of each lower metal pattern 32 overlaps with a rear end of an adjacent lower metal pattern 32 in a view along a vertical line in the drawing.

Further, hole patterns 34 are formed in such a manner that each of the hole patterns 34 lands on either a front end and a rear end of each crank-type lower metal pattern 32. Especially, the hole patterns 34 are formed in such a manner that a hole pattern 34 to land on a front end of each lower metal pattern 32 is aligned with another hole pattern 34 to land on a rear end of an adjacent lower metal pattern 32 in a view along a vertical line in the drawing.

Further, upper metal patterns 36 are formed in such a manner that each metal pattern 36 interconnects a front end of each lower metal pattern 32 and a rear end of an adjacent lower metal pattern 32 overlapping on each other in a view along a vertical line in the drawing.

In the bordered via test pattern according to the present invention as described above, each hole pattern 34 is formed to be landed on each lower metal pattern 32, considering a side margin and an end margin, with reference to on the crank-type lower metal pattern 32.

Herein, it is preferred that the side margin and the end margin are respectively 0.01 μm and 0.05 μm, and these values may change. As shown in FIG. 3b, each lower metal pattern 32 has a width of about 0.24 μm, each hole pattern 34 has a width of about 0.22 μm, an interval between crank patterns is about 0.24 μm, a hole pattern pitch to an X axis is about 0.96 μm, and a hole pattern pitch to a Y axis is about 0.48 μm. Also, upper side length and lower side length L' in the crank pattern is about 0.72 μm. In reference, the side margin and the end margin of each upper metal pattern 36 on each hole pattern 34 are about 0.09 μm and 0.09 μm.

According to the bordered via test pattern of the present invention as described above, when line shortening has occurred in each lower metal pattern 32, since the hole patterns 34 in reference marks D and E in FIG. 3a are landed on only a portion of each lower metal pattern 32, it can be determined that borderless contact between each lower metal pattern 32 and each hole patter 34 has been caused by the line shortening of the lower metal pattern 32.

Meanwhile, since each hole pattern 34 has become misaligned in only one direction, the hole pattern 34 is partially landed on one of one end or the other end of the lower metal pattern 32. Accordingly, it can be determined that borderless contact between each lower metal pattern 32 and each hole pattern 34 has been caused by the misalignment of the lower metal pattern 32.

Especially, since metal wiring of an SRAM cell block is typically shaped like a crank, each lower metal pattern is shaped like the crank as described in the present invention, so that the test pattern of the present invention can exactly reflect an SRAM cell.

Figure 4A:
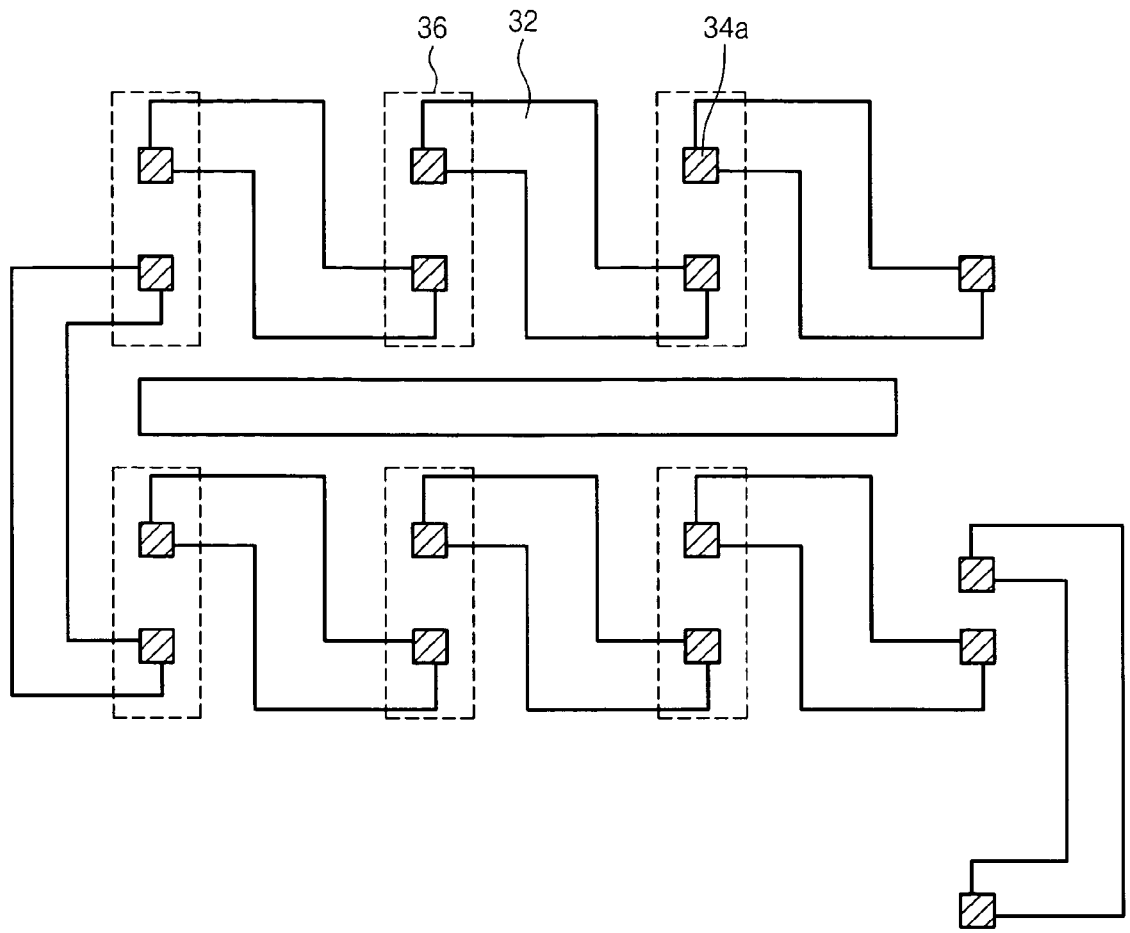
FIGS. 4a and 4b are views of a borderless via test pattern according to another embodiment of the present invention.
Figure 4B:
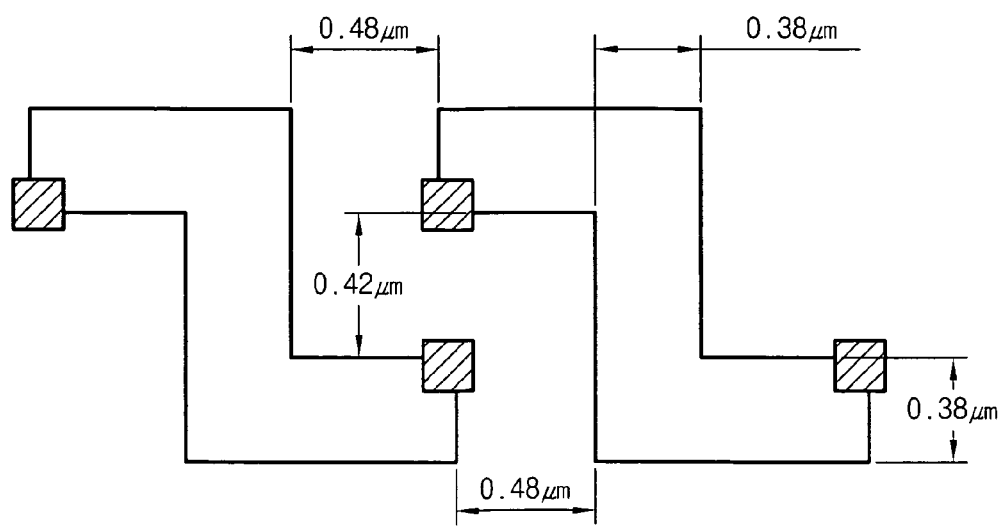

FIGS. 4a and 4b are views of a borderless via test pattern according to another embodiment of the present invention.

Referring to FIG. 4a, the borderless via test pattern according to the present invention has lower metal patterns 32 each of which shaped like a crank, similarly to the previous embodiment. Further, upper metal patterns 36 are formed in such a manner that each metal pattern 36 interconnects a front end of each lower metal pattern 32 and a rear end of an adjacent lower metal pattern 32 overlapping on each other in a view along a vertical line in the drawing.

Further, in forming hole patterns 34a in relation to the crank-type lower metal patterns having ends overlapping on each other in a view along a vertical line in order to form a borderless contact, each of the hole patterns disposed at an upper side is shifted leftward and downward in a direction inclined by a predetermined angle (e.g., 45°) so as to partly expose a front end of a lower metal pattern, and each of the hole patterns disposed at a lower side is shifted rightward and upward in a direction by a predetermined angle (e.g., 45°) so as to partly expose a rear end of a lower metal pattern.

In the borderless via test pattern as described above, as shown in FIG. 4b, a side margin and an end margin between each lower metal pattern 32 and each hole pattern 34a are about −0.01 μm and −0.05 μm respectively. Further, each lower metal pattern 32 has a width of about 0.24 μm and each upper metal pattern 36 has a width of about 0.4 μm. An interval between X axis lower metal patterns 32 is about 0.32 μm and an interval between Y axis lower metal patterns 32 is about 0.28 μm. Also, an X axis pitch between the hole patterns 34a is about 0.96 μm, and a Y axis pitch of the hole pattern 34a is about 0.48 μm. Further, each lower metal pattern 32 has a height of about 0.76 μm and a length of 0.64 μm. Furthermore, the side margin and the end margin of each upper metal pattern 36 on each hole pattern 34a are about 0.09 μm and 0.09 μm. Herein, the aforementioned design values may change.

Even in such a borderless via test pattern, alignment state between a lower metal pattern and a hole pattern can be precisely understood. In addition, it cannot be precisely determined whether the cause of failure of borderless contact between the lower metal pattern and the hole pattern is caused by line shortening of the lower metal pattern or misalignment of the hole pattern.

As described above, in the present invention, lower metal patterns are formed in such a manner that crank-type lower metal patterns are partly overlapped with each other and arranged in sequence, and hole patterns are formed in such a manner that each of the hole patterns lands on either a front end and a rear end of each crank-type lower metal pattern. Therefore, alignment state between the lower metal pattern and the hole pattern can be easily understood. In addition, when alignment failure between the lower metal pattern and the hole pattern has occurred, the cause of the alignment failure can be precisely understood.

Accordingly, in the present invention, the failure can be corrected through the precise understanding of the cause of the failure, so that device reliability can be secured and manufacturing yield can be improved.

The preferred embodiment of the present invention has been described for illustrative purposes, and those skilled in the art will appreciate that various modifications, additions and substitutions are possible, without departing from the scope and spirit of the invention as disclosed in the accompanying claims.

What is claimed is:

1. A test pattern formed in order to understand alignment state and cause of alignment failure between lower metal wiring and via contacts when multi-layer metal wiring is formed in a cell area, the test pattern comprising:

a plurality of lower metal patterns for test, each of said lower metal patterns being in the shape of a crank, each crank-shaped pattern having a first and second end, the first end of a first crank-shaped pattern being parallel and adjacent to, but displaced from the second end of a second crank-shaped pattern;

hole patterns formed in such a manner that, in relation to the crank-shaped lower metal patterns having the first end of the first lower metal pattern overlapping the second end of the second lower metal pattern such that a first hole pattern disposed at an upper side is shifted leftward and downward by a predetermined angle so as to expose the first end of the first lower metal pattern, and a second hole pattern disposed at a lower side is shifted rightward and upward by a predetermined angle so as to expose the second end of the second lower metal pattern; and upper metal patterns formed in such a manner that each upper metal pattern interconnects a front end of each lower metal pattern and a rear end of an adjacent lower metal pattern overlapping on each other in a view along a vertical line.

2. An SRAM comprising:

a plurality of lower metal patterns for test, each of said lower metal patterns being in the shape of a crank, each crank-shaped pattern having a first and second end, a first end of a first crank-shaped pattern being parallel and adjacent to, but displaced from the second end of a second crank-shaped pattern;

hole patterns formed in such a manner that, in relation to the crank-shaped lower metal patterns having the first end of the first lower metal pattern overlapping the second end of the second lower metal pattern such that a first hole pattern disposed at an upper side is shifted leftward and downward by a predetermined angle so as to expose the first end of the first lower metal pattern, and second hole pattern disposed at a lower side is shifted rightward and upward by a predetermined angle so as to expose the second end of the second lower metal pattern; and upper metal patterns formed in such a manner that each upper metal pattern interconnects a front end of each lower metal pattern and a rear end of an adjacent lower metal pattern overlapping on each other in a view along a vertical line.

* * * * *

UNITED STATES PATENT AND TRADEMARK OFFICE
CERTIFICATE OF CORRECTION

| | | |
|---|---|---|
| PATENT NO. | : 7,030,507 B2 | Page 1 of 1 |
| APPLICATION NO. | : 10/874491 | |
| DATED | : April 18, 2006 | |
| INVENTOR(S) | : Joon Hyeon Lee | |

It is certified that error appears in the above-identified patent and that said Letters Patent is hereby corrected as shown below:

On the title page, at Item (30), Foreign Application Priority Data, "00699809" should read as -- 0069809 --.

Signed and Sealed this

Twenty-seventh Day of May, 2008

JON W. DUDAS
*Director of the United States Patent and Trademark Office*